United States Patent

Chan

[15] 3,638,079

[45] Jan. 25, 1972

[54] COMPLEMENTARY SEMICONDUCTOR DEVICES IN MONOLITHIC INTEGRATED CIRCUITS

[72] Inventor: Tsiu C. Chan, Woburn, Mass.

[73] Assignee: Sylvania Electric Products Inc.

[22] Filed: Jan. 28, 1970

[21] Appl. No.: 6,407

[52] U.S. Cl. ........................317/235 R, 317/235 E, 148/175

[51] Int. Cl. ........................H01l 19/00

[58] Field of Search ........................317/235

[56] References Cited

UNITED STATES PATENTS

| | | | |
|---|---|---|---|
| 3,349,300 | 10/1967 | Koepp et al. | 317/235 |
| 3,450,963 | 6/1969 | Tsai | 317/235 |
| 3,474,308 | 10/1969 | Kronlage | 317/235 |

FOREIGN PATENTS OR APPLICATIONS

| | | | |
|---|---|---|---|
| 1,422,157 | 11/1965 | France | 317/235 |

*Primary Examiner*—Jerry D. Craig

*Attorney*—Norman J. O'Malley, Elmer J. Nealon and David M. Keay

[57] ABSTRACT

Monolithic integrated circuit structure having an N-type substrate, a first P-type epitaxial layer, and a second N-type epitaxial layer. N-type isolation barriers extend through the P-type epitaxial layer and P-type isolation barriers extend through the N-type epitaxial layer to provide sectors including electrically isolated sections of the epitaxial layers. PNP and NPN-bipolar transistors of standard configuration, and N-channel and P-channel junction field-effect transistors may each be fabricated in different sectors.

8 Claims, 15 Drawing Figures

INVENTOR
TSIU C. CHAN
BY David M. Keay
AGENT

INVENTOR
TSIU C. CHAN
BY David M. Keay
AGENT

INVENTOR
TSIU C. CHAN
BY David M. Keay

INVENTOR
TSIU C. CHAN
BY David M. Kay
AGENT

PATENTED JAN 25 1972 3,638,079

SHEET 5 OF 8

INVENTOR
TSIU C. CHAN
BY David M. Keay
AGENT

INVENTOR
TSIU C. CHAN
BY David M. Kay
AGENT

INVENTOR
TSIU C. CHAN
BY David M. Kay
AGENT

PATENTED JAN 25 1972

3,638,079

SHEET 8 OF 8

INVENTOR
TSIU C. CHAN

BY David M. Keay

AGENT

COMPLEMENTARY SEMICONDUCTOR DEVICES IN MONOLITHIC INTEGRATED CIRCUITS

BACKGROUND OF THE INVENTION

This invention relates to semiconductor electrical translating devices. More particularly, it is concerned with monolithic integrated circuits having complementary transistors.

Monolithic integrated circuits which employ bipolar transistors usually are fabricated with transistors of one type, typically NPN-transistors. If the circuitry requires complementary transistors, PNP-bipolar transistors may be fabricated simultaneously with the fabrication of NPN-transistors. However, either additional diffusion steps must be performed or transistors of one type may be fabricated in the so-called lateral configuration. Because of problems in obtaining narrow base widths in lateral transistors, these devices have poor frequency response in comparison to devices of standard configuration. Furthermore, in certain instances it may be desirable fabricate junction type field-effect transistors in the same monolithic semiconductor body with bipolar transistors.

BRIEF SUMMARY OF THE INVENTION

A monolithic integrated circuit structure in accordance with the invention which contains complementary bipolar transistors includes a substrate of semiconductor material of one conductivity type. A first layer of semiconductor material of the opposite conductivity type is contiguous the substrate and a second layer of semiconductor material of the one conductivity type is contiguous the first layer. A first isolation barrier of the one conductivity type extends through the first layer into the substrate and into the second layer to form a first sector including an electrically isolated section of the first layer and the overlying section of the second layer. A second isolation barrier of the opposite conductivity type extends through the second layer to the first layer to form a second sector including an electrically isolated section of the second layer.

A first bipolar transistor is located within the first sector and includes a collector region formed of semiconductor material of the second layer which has been converted to the opposite conductivity type; a base region formed of semiconductor material of the second layer of the one conductivity type; and an emitter region formed of semiconductor material of the second layer which has been converted to the opposite conductivity type.

A second bipolar transistor, complementary to the first bipolar transistor, is located within the second sector and includes a collector region formed of semiconductor material of the second layer of the one conductivity type; a base region formed of semiconductor material of the second layer which has been converted to the opposite conductivity type; and an emitter region formed of semiconductor material of the second layer of the one conductivity type.

The monolithic integrated circuit structure may also include a third isolation barrier of the one conductivity type extending through the first layer to the substrate and into the second layer to form a third sector including an electrically isolated section of the first layer and the overlying section of the second layer. A junction field-effect transistor is located within this sector and includes a source region formed of semiconductor material of the second layer of the one conductivity type and having a surface area in the surface of the second layer, and a drain region formed of semiconductor material of the second layer of the one conductivity type and having a surface area in the surface of the second layer. A first gate region of graded resistivity is formed of semiconductor material of the second layer which has been converted to the opposite conductivity type. The first gate region has a surface area in the surface of the second layer and lies interposed between the source and drain regions. The channel region of the device is of uniform resistivity and is formed of semiconductor material of the second layer of the one conductivity type. The channel region extends between the source and drain regions. A second gate region of graded resistivity is formed of semiconductor material of the second layer which has been converted to the opposite conductivity type. The second gate region completely surrounds the source, drain, and channel regions and has a surface area in the surface of the second layer.

The structure may also include a junction field-effect transistor of the opposite conductivity type located within a fourth sector including an electrically isolated section of the first layer and the overlying section of the second layer. The fourth sector is formed by a fourth isolation barrier of the one conductivity type extending through the first layer into the substrate and into the second layer. The source and drain regions of the device are each formed of semiconductor material of the first layer of the opposite conductivity type. Source and drain contacts are formed of semiconductor material of the second layer which has been converted to the opposite conductivity type. The source and drain contacts each have a surface area in the surface of the second layer and extend, respectively, to the source and drain regions. A gate region of graded resistivity is formed of semiconductor material of the first layer which has been converted to the one conductivity type and lies interposed between the source and drain regions. A channel region of uniform resistivity is formed of semiconductor material of the first layer of the opposite conductivity type and extends between the source and drain regions.

Monolithic integrated circuit structures according to the invention may be fabricated by epitaxially depositing a first layer of semiconductor material of the opposite conductivity type on the surface of a substrate of semiconductor material of the one conductivity type.

Conductivity type imparting material of the one conductivity type is diffused into first isolation barrier forming regions at the surface of the first layer. Conductivity type imparting material of the opposite conductivity type is diffused into second isolation barrier forming regions and into a collector forming region at the surface of the first layer.

A second epitaxial layer is then deposited on the surface of the first epitaxial layer. Conductivity type imparting material of the opposite conductivity type is diffused into second isolation barrier forming regions at the surface of the second layer overlying the second isolation barrier forming regions of the first layer. At the same time, conductivity type imparting material of the opposite conductivity type is diffused into a collector ring forming region at the surface of the second layer which generally overlies the collector forming region of the first layer. Then, conductivity type imparting material of the opposite conductivity type is diffused into a first emitter forming region at the surface of the second layer which lies within and is spaced from the collector ring forming region. At the same time, conductivity type imparting material of the opposite conductivity type is diffused into a base-forming region at the surface of the second layer which is spaced from the collector ring forming region by a first isolation barrier forming region and a second isolation barrier forming region.

Conductivity type imparting material of the one conductivity type is diffused into a second emitter region at the surface of the second layer which lies within and is completely surrounded by the base-forming region.

The conductivity type imparting materials continue to diffuse during subsequent diffusion steps. The first isolation barrier forming regions expand to form first isolation barriers of the one conductivity type which extend through the first layer into the substrate and into the second layer to form a first sector including an electrically isolated section of the first layer and the overlying section of the second layer. The second isolation barrier forming regions expand to form second isolation barriers of the opposite conductivity type which extend through the second layer to the first layer to form a second sector including an electrically isolated section of the second layer. The collector forming region and the collector ring forming region expand to form a continuous collector region of the opposite conductivity type which surrounds a portion of the first layer of the one conductivity type and the first emitter region of the opposite conductivity type.

BRIEF DESCRIPTION OF THE DRAWINGS

Additional objects, features, and advantages of monolithic integrated circuits in accordance with the invention will be apparent from the following detailed discussion together with the accompanying drawings wherein.

In the figures the various elements are not drawn to scale. Certain dimensions are exaggerated in relation to other dimensions in order to present a clearer understanding of the invention.

DETAILED DESCRIPTION OF THE INVENTION

In fabricating a monolithic integrated circuit structure containing complementary devices in accordance with the invention as illustrated in the FIGS. a slice, or substrate, of single crystal semiconductor material of one conductivity type is provided as a supporting structure. The substrate is usually a slice of relatively large surface area upon which many circuit networks, each including many devices are fabricated simultaneously. However, for purposes of clarity the production of only a few illustrative devices in a portion of a circuit or a fragment of a slice will be shown and described. In the following description silicon is employed as the semiconductor material, although the teachings are obviously applicable to other semiconductor materials. Also, by way of example, the substrate is of N-type conductivity.

Figure 1:
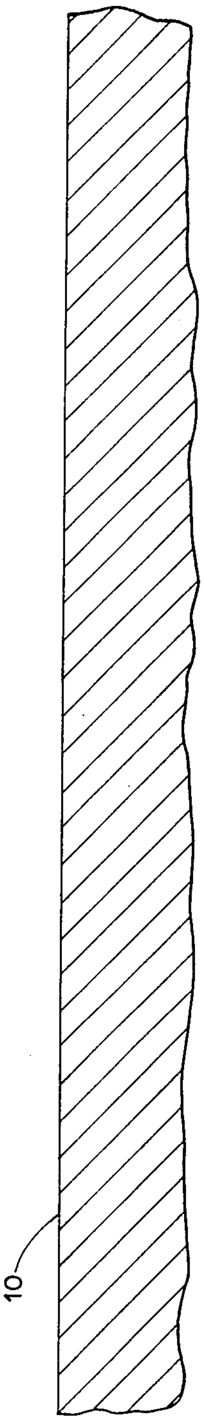
FIG. 1 is an elevational view in cross section of a fragment of a wafer of silicon.
Figure 2:
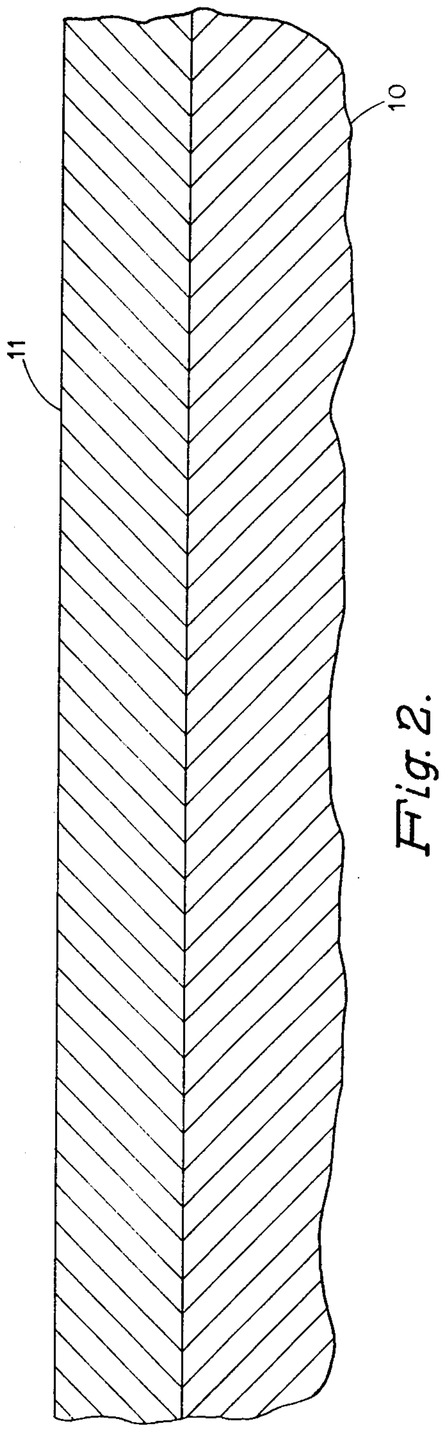
FIg. 2 is an elevational view in cross section of the fragment of the wafer with a first epitaxial layer deposited thereon.

A slice or wafer 10 of N-type silicon of uniform resistivity having flat, planar, parallel, opposed major surfaces, a fragment of which is shown in FIG. 1, is produced by any of known techniques of crystal fabrication including appropriate slicing and cleaning operations. The substrate 10 is placed in a suitable furnace apparatus, and is illustrated in FIG. 2 an epitaxial layer 11 of P-type silicon of uniform resistivity is grown on the surface as by known vapor decomposition techniques. A gaseous compound of silicon mixed with a controlled quantity of a gaseous compound of a P-type conductivity type imparting material is reacted with hydrogen at the surface of the slice to cause deposition of silicon doped with the conductivity type imparting material. A layer 11 which is precisely controlled as to thickness and as to resistivity and which is a continuation of the crystalline structure of the single crystal silicon substrate 10 is thus deposited on the surface of the substrate. The upper surface of the epitaxial layer is parallel to the interface between the substrate and the layer.

Figure 3A:
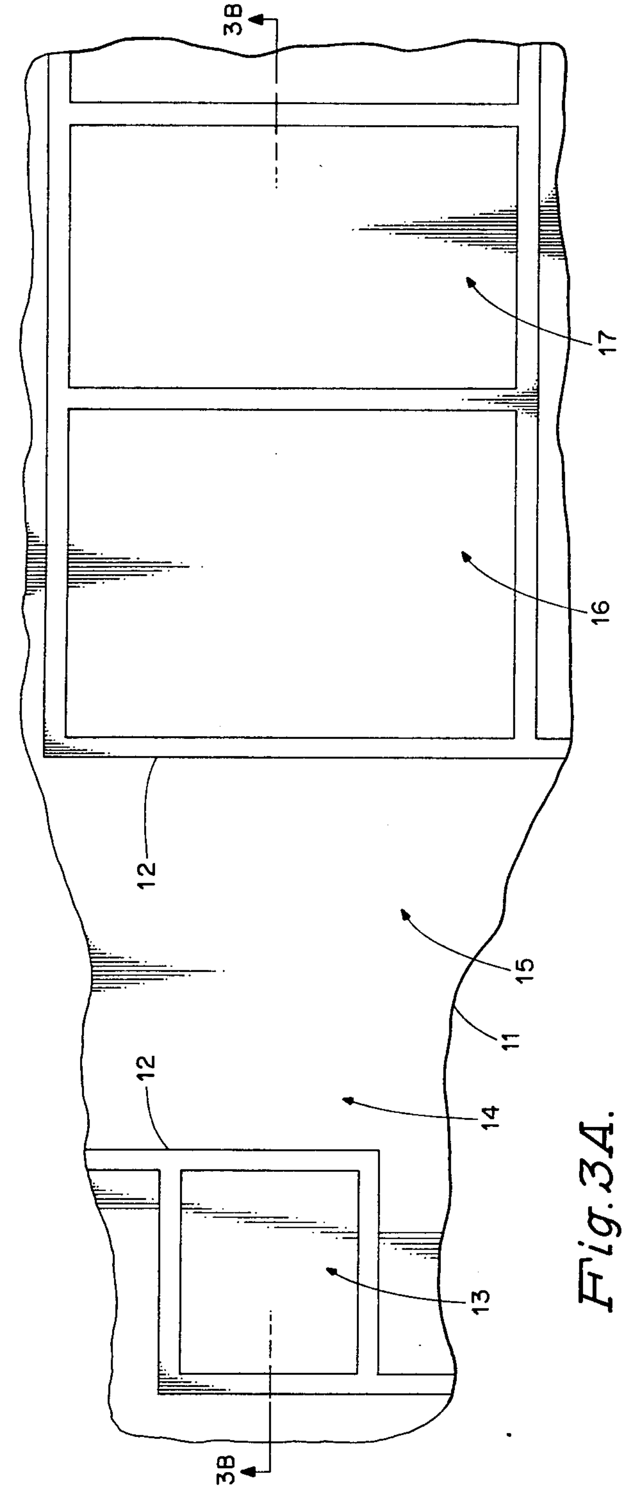
FIG. 3A is a topographic view of the fragment of the wafer after a first diffusion step.
Figure 3B:
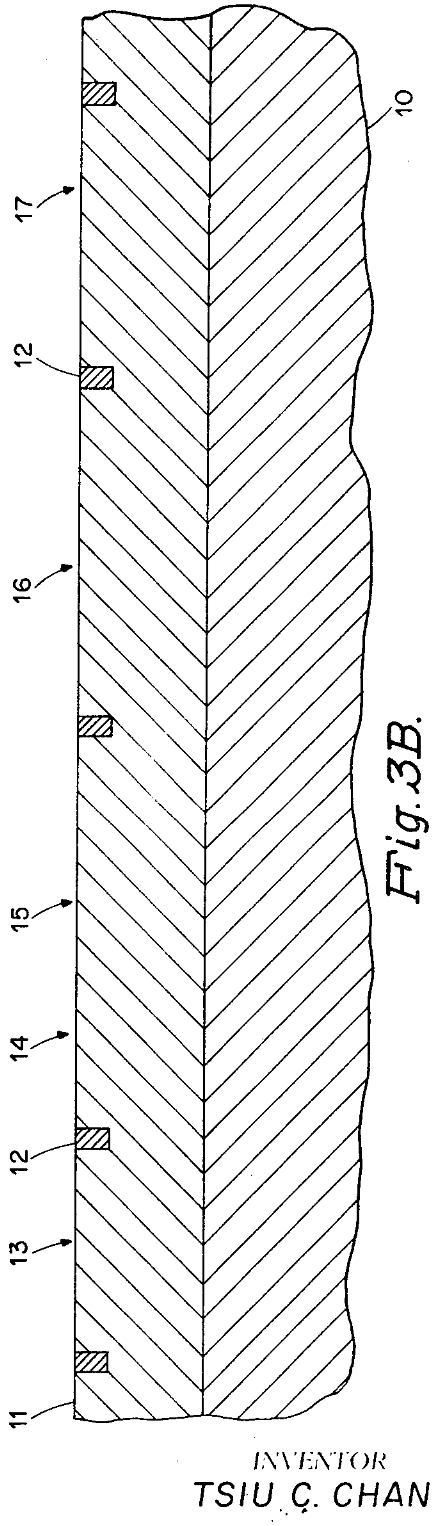
FIG. 3B is an elevational view in cross section of the fragment of the wafer taken along the line 3B—3B of FIG. 3A.

Next, as illustrated in FIGS. 3A and 3B a pattern of N-type regions 12 are formed in the surface of the P-type epitaxial layer by conventional diffusion techniques. In order to diffuse N-type conductivity imparting material only into the portions desired, known techniques of diffusing through openings in an adherent protective coating are employed.

According to one well-known technique an adherent nonconductive protective coating of silicon oxide is formed on the surface of the silicon wafer as by heating in a wet oxygen atmosphere. The oxide coating is covered with a photoresist solution and the photoresist is exposed to ultraviolet light through a mask shielding the areas through which the conductivity type imparting material is to be diffused. The photoresist in these areas is thus not exposed to the light, and after the exposed portions are developed the exposed resist on these areas is easily washed off while the exposed portions remain. The oxide coating unprotected by the resist is removed in an etching solution which does not attack the resist, thereby forming openings of the desired configuration in the oxide coating. The previously exposed photoresist is then dissolved to leave only the oxide coating with the openings of the desired configuration on the surface of the silicon wafer. The wafer is treated in a diffusion furnace to diffuse an N-type conductivity imparting material through the openings in the oxide into the regions 12 of the P-type epitaxial layer.

The N-type regions 12 serve as first isolation barrier forming regions of N-type conductivity as will be apparent hereinbelow. The pattern of N-type isolation barrier forming regions 12 is arranged so as to provide for producing particular devices in particular portions of the fragment. A PNP-bipolar transistor will be fabricated in the portion indicated generally at 13, an NPN-bipolar transistor will be fabricated in the portion indicated generally at 14, a resistor will be fabricated in the portion indicated generally at 15, an N-channel junction type field-effect transistor will be fabricated in the portion indicated generally at 16, and a P-channel junction type field-effect transistor will be fabricated in the portion indicated generally at 17.

Figure 4A:
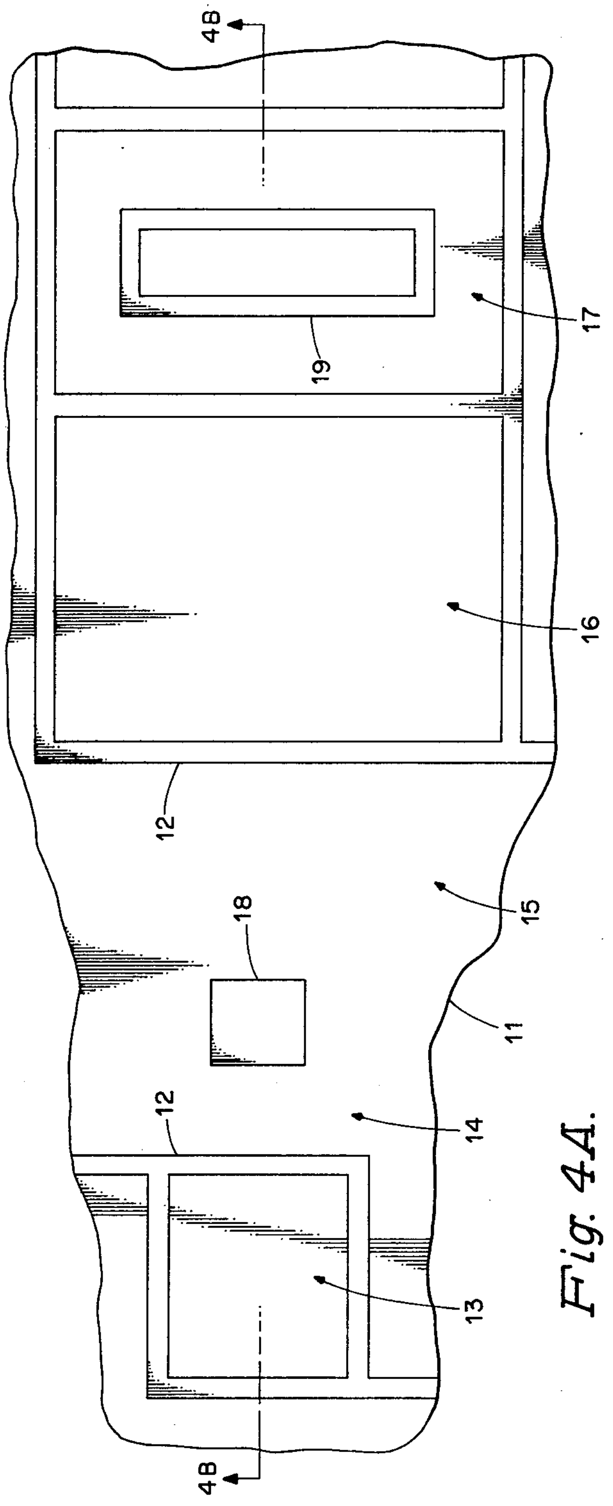
FIGS. 4A and 5A are topographic views of the fragment of the wafer after subsequent diffusion steps.
Figure 4B:
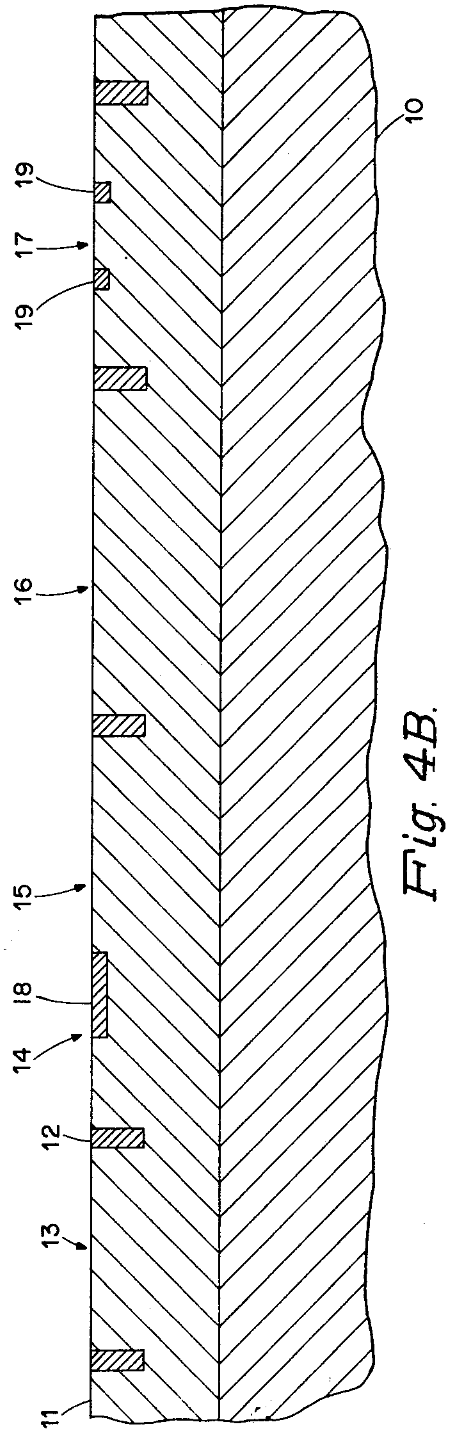
FIGS. 4B and 5B are corresponding elevational views in cross section.

As illustrated in FIGS. 4A and 4B the wafer is treated in accordance with conventional techniques to diffuse N-type conductivity imparting material into the surface of the P-type epitaxial layer to form what will become a buried zone 18 of the collector of the NPN-bipolar transistor and the gate region 19 of the P-channel field-effect transistor.

Figure 5A:
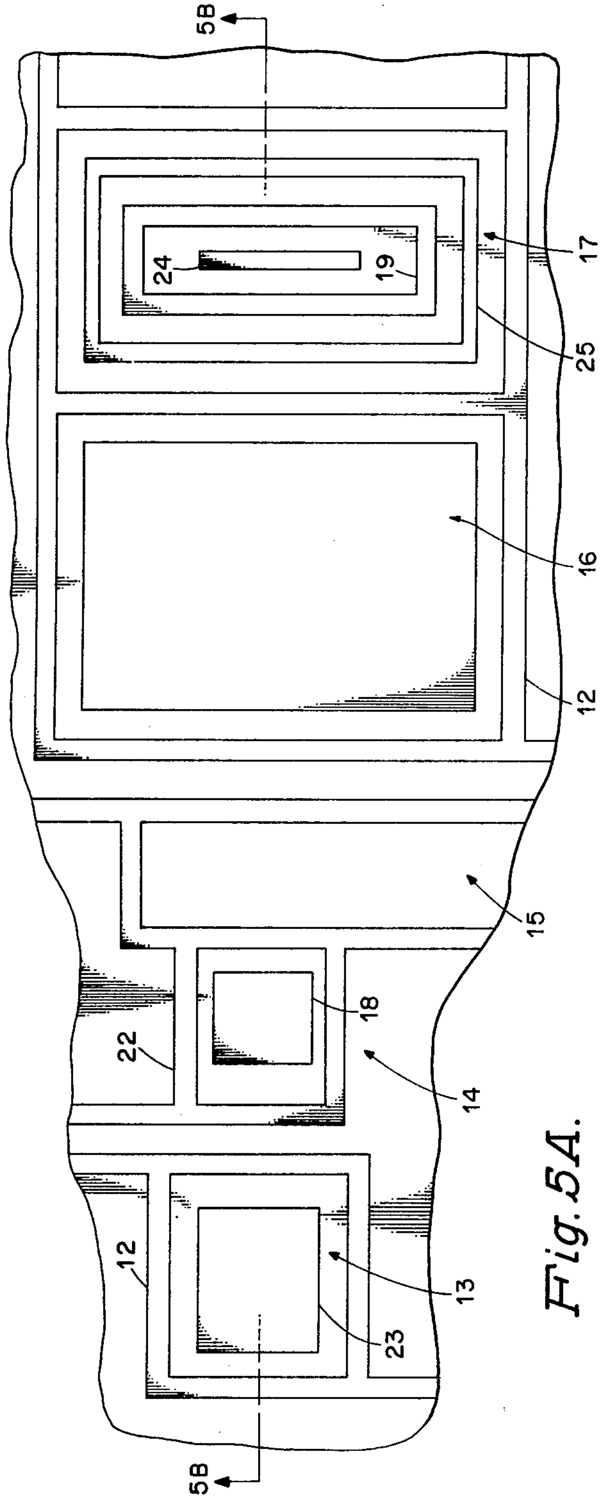
Figure 5B:
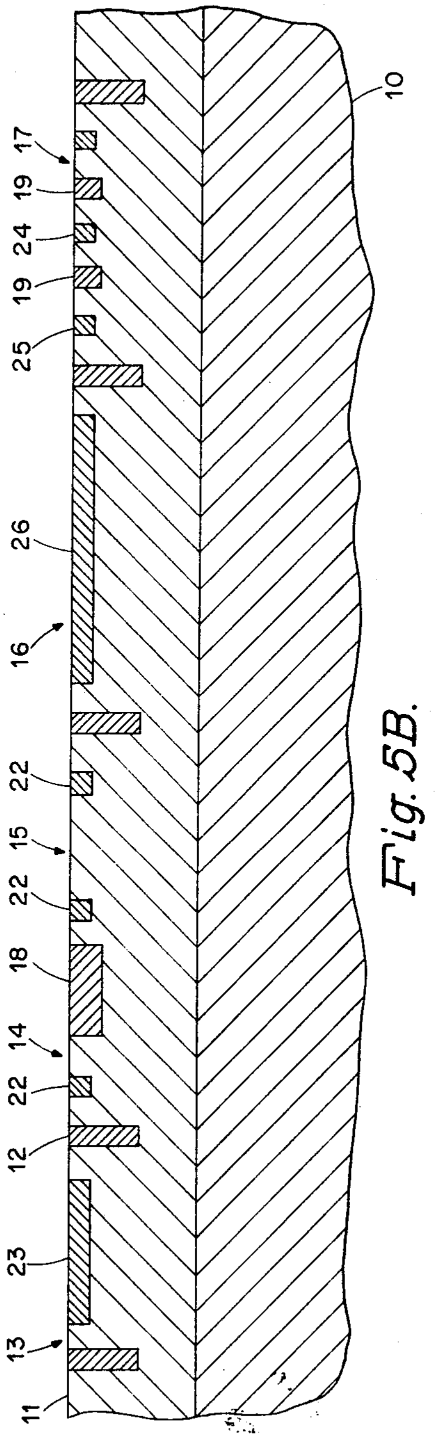

As illustrated in FIGS. 5A and 5B the wafer is then treated by diffusing P-type conductivity imparting material into various regions of the P-type epitaxial layer to form regions of high concentration of conductivity type imparting material. Regions 22 serve as second isolation barrier forming regions of P-type conductivity. Region 23 serves as a collector forming region for the collector of the PNP-transistor. Region 26 is the second gate forming region for the N-channel field-effect transistor. Regions 25 and 24 are the source and drain regions, respectively, for the P-channel field-effect transistor.

Figure 6:
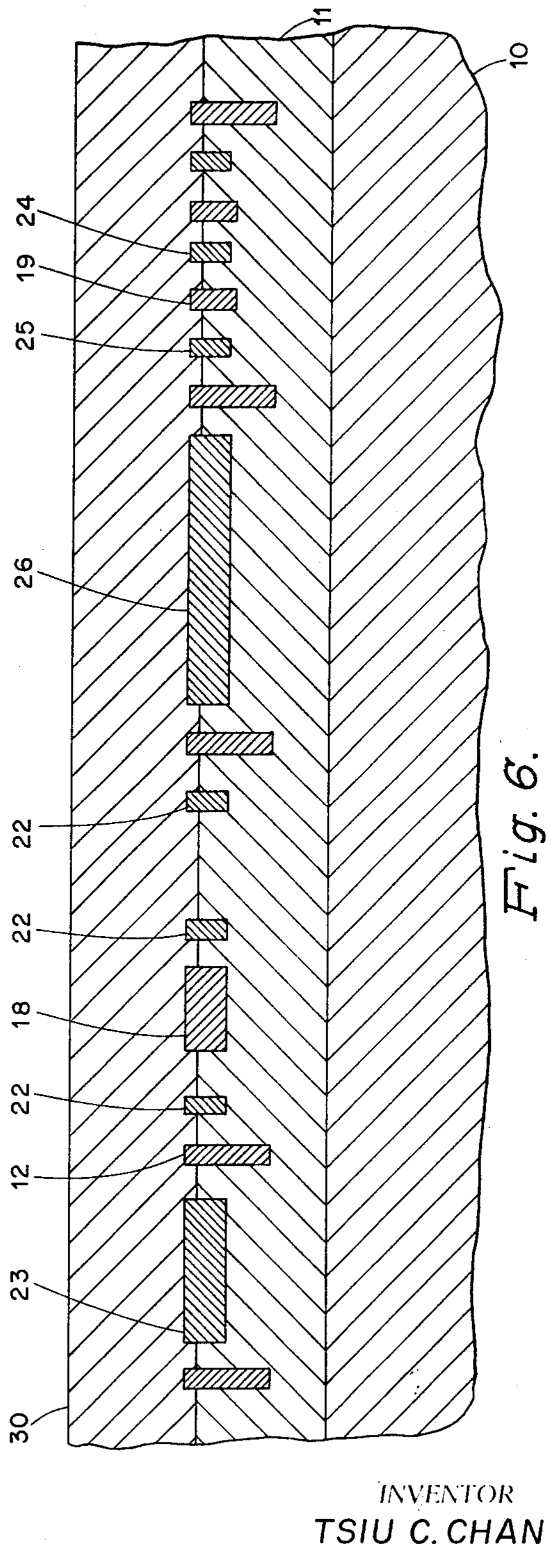
FIG. 6 is an elevational view in cross section of the fragment of the wafer with a second epitaxial layer deposited thereon.

Next, as illustrated in FIG. 6 an N-type epitaxial layer 30 of silicon is deposited on the surface of the P-type epitaxial layer 11. The N-type epitaxial layer may be deposited in the same manner as the P-type epitaxial layer so as to provide a layer of uniform resistivity which is a continuation of the single crystal structure of the first epitaxial layer and of the substrate and has an upper surface parallel with the interface between the first and second layers and the interface between the first layer and the substrate.

Figures 7A, 7B:
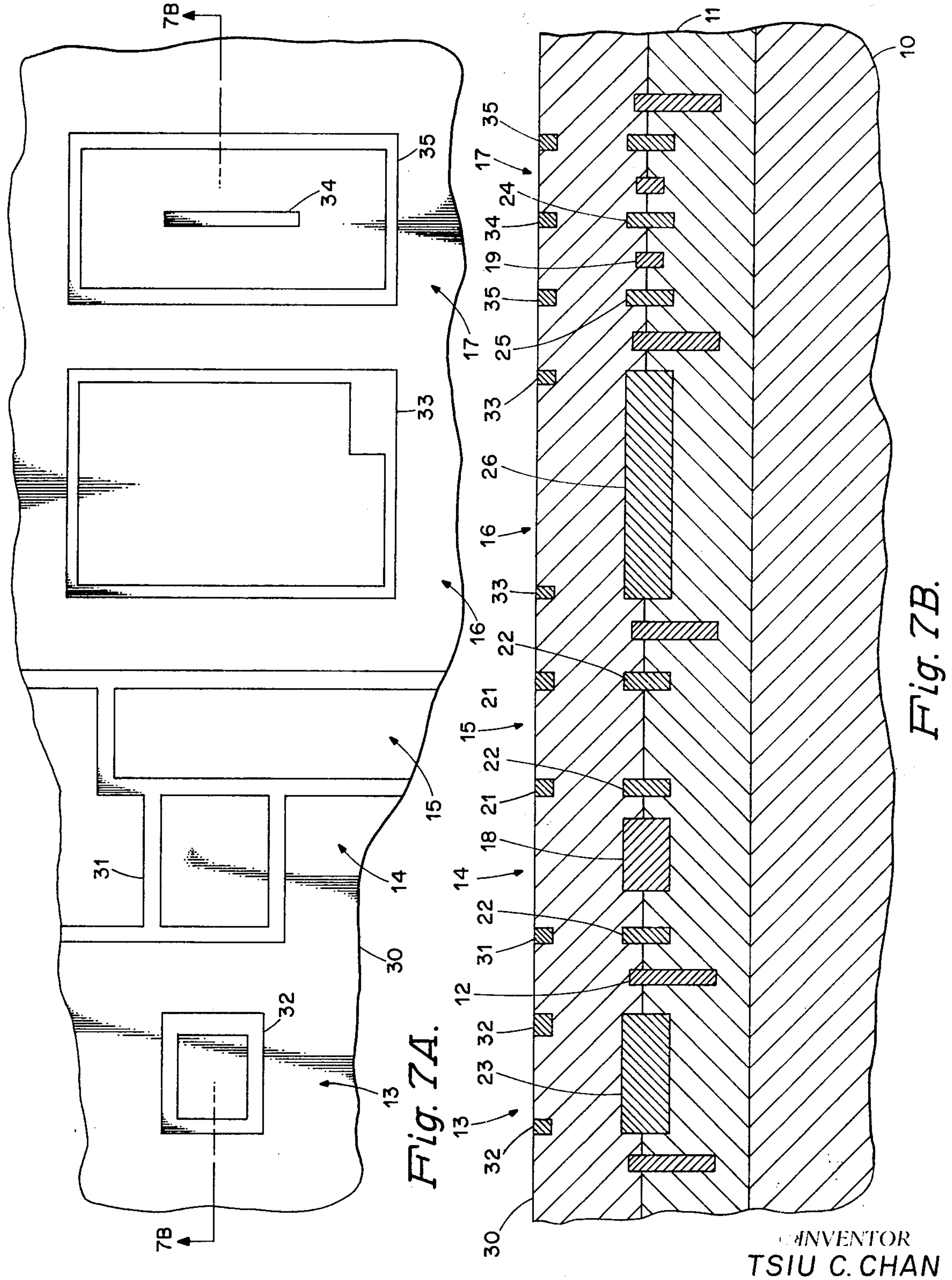
FIGS. 7A, 8A, and 9A are topographic views of the fragment of the wafer after successive diffusion steps.
FIGS. 7B, 8B, and 9B are corresponding elevational views in cross section.

P-type conductivity imparting material is then diffused into the wafer as illustrated in FIGS. 7A and 7B. The P-type material is diffused into isolation barrier forming regions 31 which overlie the P-type isolation barrier forming regions 22 previously formed in the first epitaxial layer 11. At the same time, P-type material is diffused into a collector ring forming region 32 which will contact the underlying collector region 23 of the PNP-transistor. A P-type ring 33 is formed which will contact the underlying second gate region of the N-channel field-effect transistor. Also formed are regions 35 and 34 which will provide contacts to the underlying source 25 and drain 24 regions of the P-channel field-effect transistor.

Figures 8A, 8B:
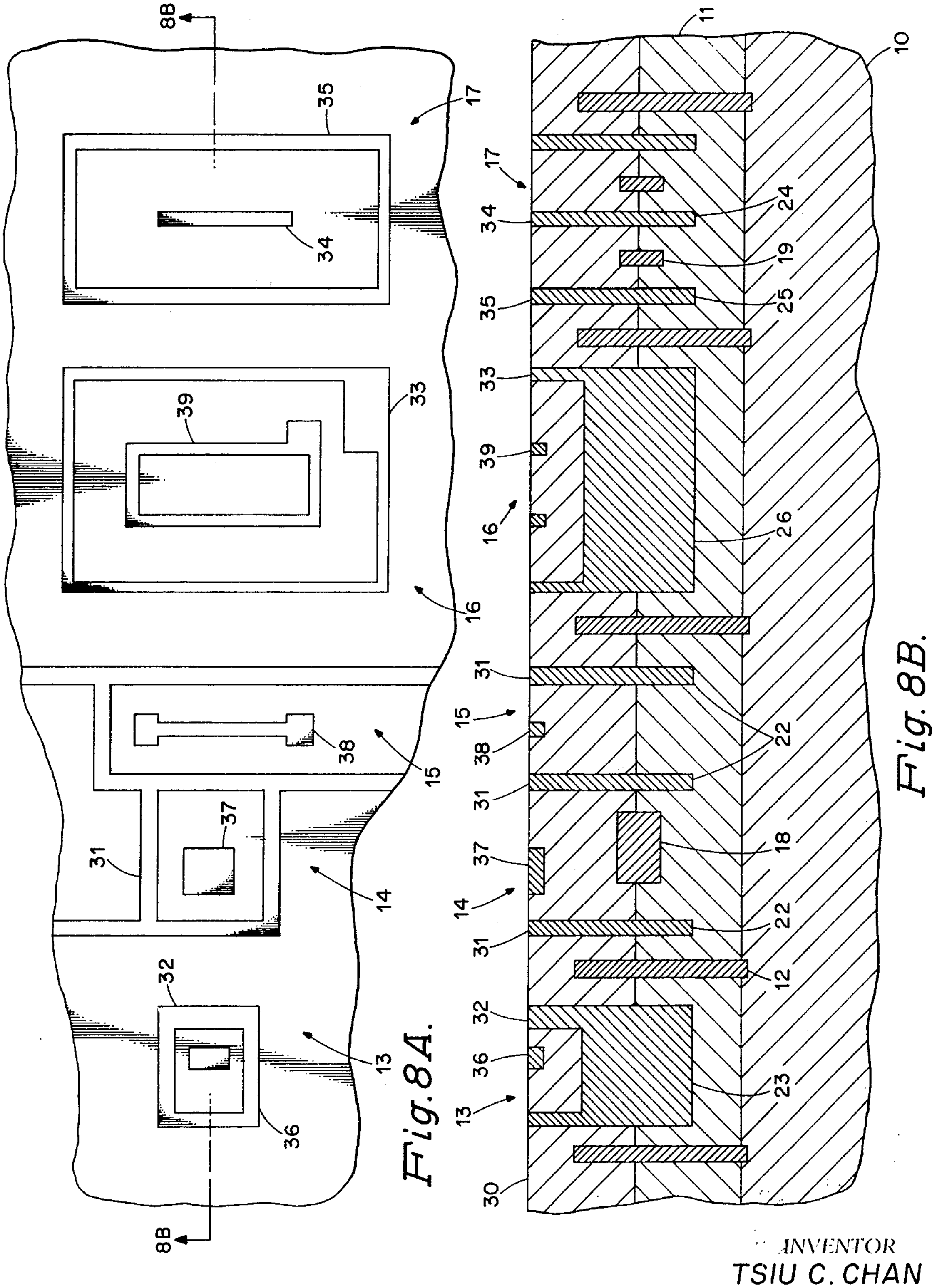

The wafer is subjected to another P-type diffusion treatment to form regions which are to penetrate into the N-type epitaxial layer at a depth less than the regions formed in the previous P-type diffusion as illustrated in FIGS. 8A and 8B. The regions formed during this diffusion step are the emitter region 36 of the PNP-transistor, the base region 37 of the NPN-transistor, a resistance 38, and the first gate region 39 of the N-channel field-effect transistor.

Figure 9A:
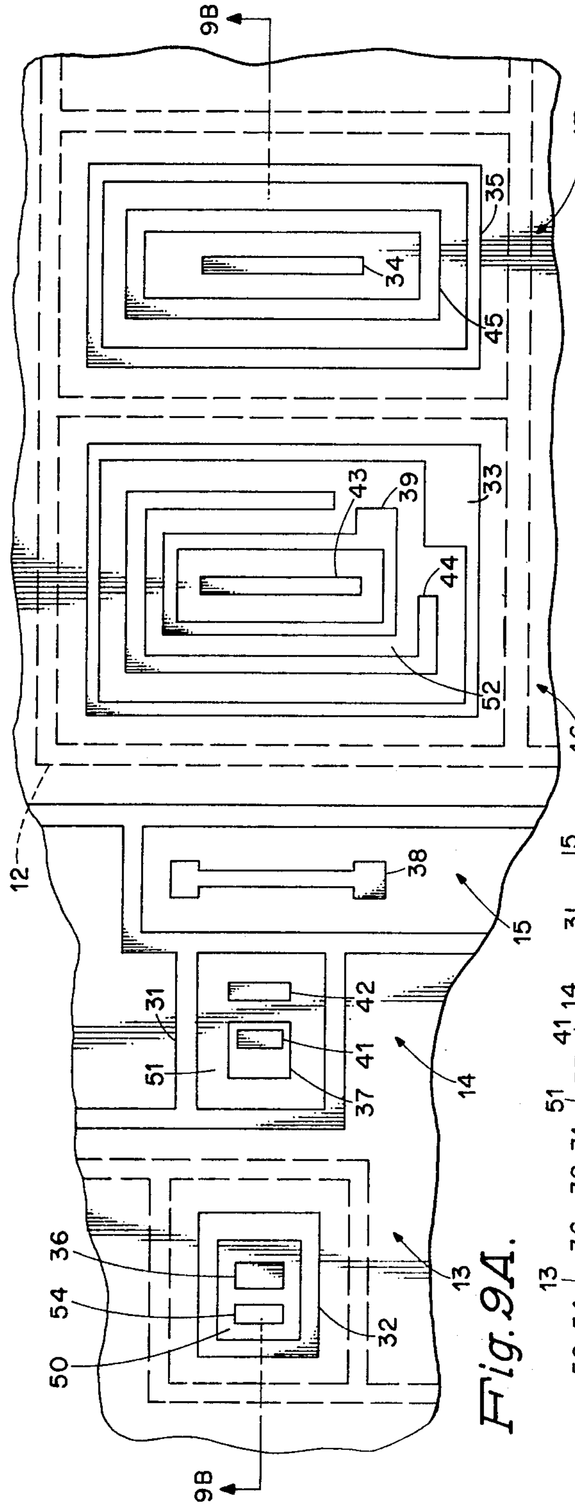
Figure 9B:
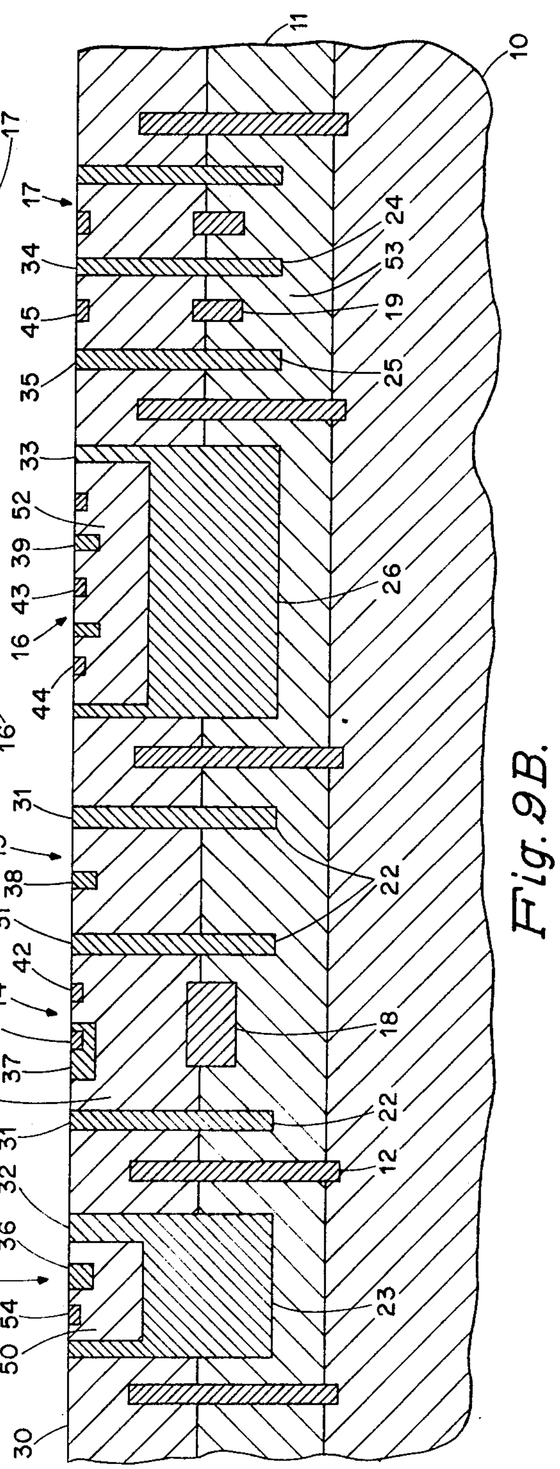

Next, the wafer is treated to diffuse N-type conductivity imparting material into the surface of the wafer as illustrated in FIGS. 9A and 9B. During this step the emitter region 41 of the NPN-transistor is formed. At the same time, high conductivity N-type contact regions 42, 43, 44, 45 and 54 are formed to facilitate making low resistance electrical connections to the collector region 18 of the NPN-transistor, the drain and source of the N-channel field-effect transistor, the gate region 19 of the P-channel field-effect transistor, and the base region of the PNP-transistor, respectively.

As is well understood, each diffusion step causes conductivity type imparting materials already diffused into the semiconductor material during previous operations to diffuse farther into the adjacent semiconductor material. Thus, after the final N-type diffusion step, the diffused regions have expanded as illustrated in FIG. 9B.

The N-type isolation barrier forming regions 12 have expanded completely through the P-type epitaxial layer 11, and the P-type isolation barrier forming regions 22 and 31 have expanded into each other to form P-type isolation barrier regions extending completely through the N-type epitaxial layer 30. As illustrated in FIGS. 9A and 9B the two sets of isolation barriers permit electrical isolation of various sections of the wafer providing the sectors 13, 14, 15, 16, and 17 within which are fabricated a PNP-transistor, NPN-transistor, a resistance, an N-channel field-effect transistor, and a P-channel field-effect transistor, respectively.

The sector 13 contains a PNP-bipolar transistor of standard configuration. The collector region includes the diffused region 23 and the collector ring 32 which have expanded to produce a continuous collector region in the second epitaxial layer 30. The uncovered portion 50 of the N-type epitaxial layer 30 lying within the collector region 23 plus 32 forms the base region. The P-type diffused region 36 within the base region is the emitter region.

An NPN-bipolar transistor is located within the sector 14. The unconverted portion 51 of the N-type epitaxial layer 30 forms the collector region. The N-type buried zone 18 which has expanded into the second epitaxial layer 30 provides the conventional function of a buried zone in the collector of a double-diffused planar transistor. The diffused P-type region 37 is the base region of the device, and the double-diffused N-type region 41 within the base region is the emitter region.

Sector 15 contains a conventional resistance 38 of P-type material formed simultaneously with the diffusion of the base region 37 of the NPN-transistor.

Sector 16 contains an N-channel junction field-effect transistor with two gates. The N-type diffused regions 44 and 43 provide low resistivity source and drain regions, respectively. The diffused P-type region 39 is the first gate region, and the diffused regions 26 and 33 have expanded to form a continuous second gate region in the second epitaxial layer 30. The unconverted portion 52 of the N-type epitaxial layer 30 provides an N-type channel extending between the source 44 and drain 43 regions.

A P-channel junction field-effect transistor is located in sector 17. P-type diffused regions 25 and 24 in the first epitaxial layer 11 provide source and drain regions, respectively. P-type diffused regions 35 and 34 which extend from the surface of the second epitaxial layer 30 through the layer to the source and drain regions 25 and 24 serve as contacts to the source and drain regions, respectively. The N-type diffused region 19 in the first epitaxial layer 11 is a gate region. The low resistivity N-type diffused region 45 together with the unconverted N-type material of the second epitaxial layer 30 lying between the diffused regions 45 and 19 serve to provide for making connection the gate region 19. The unconverted portion 53 of the first epitaxial layer 11 provides a P-type channel between the source and drain regions 25 and 24.

In accordance with well understood conventional practice in the semiconductor art, a protective coating of silicon oxide (not shown) is provided over the surface of the structure and suitable electrical connections are made to the regions of the wafer through openings in the oxide coating.

In the fabrication of a typical integrated circuit incorporating structure in accordance with the invention, the starting material or substrate 10 was a slice of single crystal N-type silicon lightly doped with arsenic to produce a uniform resistivity of approximately 5 ohm-centimeters. The P-type epitaxial layer 11 of silicon was doped with boron during deposition to provide a uniform resistivity of 10 ohm-centimeters. The P-type epitaxial layer 11 was 10 microns thick.

The first N-type diffusion to form the first isolation barrier forming regions 12 employed phosphorus as the conductivity type imparting material. The N-type buried zone 18 and the gate region 19 were formed by diffusing antimony into the surface of the P-type epitaxial layer 11. Antimony was employed for forming these regions rather than phosphorus since it diffuses at a slower rate than does the phosphorus during the subsequent heating steps. The P-type regions 22, 23, 24, 25, and 26 were formed by diffusing boron into the surface of the P-type epitaxial layer 11.

The N-type epitaxial layer 30 was formed by doping the silicon during deposition with arsenic so as to form a layer of 1.5 ohm-centimeters uniform resistivity 10 microns thick. The P-type regions 31, 32, 33, 34, and 35 were formed by diffusing boron into the surface of the N-type epitaxial layer 30. The wafer was then subjected to another diffusion step employing boron to form the P-type regions 36, 37, 38, and 39. This diffusion was carried out under conditions of temperature and time to produce relatively shallow penetration of boron into the epitaxial layer. The last N-type diffusion to form the regions 41, 42, 43, 44, 45, and 54 employed phosphorous as the conductivity-type imparting material.

As is well known, the diffused regions may be considered graded regions or regions of graded resistivity which are inherently formed by reason of the diffusion procedures employed. That is, by virtue of the fact that the diffusion is accomplished by introduction of the conductivity-type imparting materials at the exposed surface areas, the concentration of the conductivity-type imparting materials in the respective regions decreases with distance from the surfaces at which they are introduced.

The present invention makes possible the fabrication of complementary bipolar transistors and also complementary field-effect transistors in the same monolithic integrated circuit. The bipolar transistors are both of standard configuration. That is, neither is of the so-called lateral type. All of the operations required to produce the monolithic integrated circuit structure in accordance with the invention are compatible with existing fabrication technology and are individually conventional well-known operations.

While there has been shown and described what is considered a preferred embodiment of the present invention, it will be obvious to those skilled in the art that various changes and modifications may be made therein without departing from the invention as defined by the appended claims.

What is claimed is:

1. A monolithic integrated circuit structure comprising
a substrate of semiconductor material of one conductivity type;
a first layer of semiconductor material of the opposite conductivity type contiguous the substrate;
a second layer of semiconductor material of the one conductivity type contiguous the first layer;
a first isolation barrier of the one conductivity type extending through the first layer into the substrate and into the second layer to form a first sector including an electrically isolated section of the first layer and the overlying section of the second layer;
a second isolation barrier of the opposite conductivity type extending through the second layer to the first layer to form a second sector including an electrically isolated section of the second layer;
a first bipolar transistor within the first sector including
a collector region of the opposite conductivity type formed at the interface of said first and second layers and having portions extending to the surface of said second layer;

a base region of semiconductor material of the second layer of the one conductivity type; and an emitter region formed of semiconductor material of the second layer converted to the opposite conductivity type;

a second bipolar transistor, complementary to the first bipolar transistor, within the second sector including a collector region formed of semiconductor material of the second layer of the one conductivity type;

a base region formed of semiconductor material of the second layer converted to the opposite conductivity type; and an emitter region formed of semiconductor material of the second layer of the one conductivity type.

2. A monolithic integrated circuit structure in accordance with claim 1 wherein said first layer of semiconductor material is contiguous said substrate at a flat, planar interface;

said second layer of semiconductor material is contiguous said first layer at a flat, planar interface parallel to the first-mentioned interface;

said second layer has a flat, planar surface parallel to the interfaces;

the emitter-base and collector-base junctions of the first and second bipolar transistors terminate at said surface;

the collector region of the first bipolar transistor is of graded resistivity;

the base region of the first bipolar transistor is of uniform resistivity;

the emitter region of the first bipolar transistor is of graded resistivity;

the collector region of the second bipolar transistor is of uniform resistivity;

the base region of the second bipolar transistor is of graded resistivity; and the emitter region of the second bipolar transistor is of graded resistivity.

3. A monolithic integrated circuit structure in accordance with claim 2 wherein the collector region of the first bipolar transistor includes a zone of the opposite conductivity type of graded resistivity formed by diffusion of conductivity-type imparting material into the second layer at the interface between the first and second layers; and a ring of the opposite conductivity type of graded resistivity formed by diffusion of conductivity-type imparting material into the second layer at the surface of the second layer;

said ring extending to said zone.

4. A monolithic integrated circuit structure in accordance with claim 3 including a buried zone of the one conductivity type of graded resistivity formed in the second sector by diffusion of conductivity-type imparting material into the second layer at the interface between the first and second layers.

5. A monolithic integrated circuit structure in accordance with claim 4 wherein the one conductivity type is N-type; and the opposite conductivity type is P-type;

whereby the first bipolar transistor is a PNP-transistor and the second bipolar transistor is an NPN-transistor.

6. A monolithic integrated circuit structure in accordance with claim 2 including a third isolation barrier of the one conductivity type extending through the first layer into the substrate and into the second layer to form a third sector including an electrically isolated section of the first layer and the overlying section of the second layer;

a first junction field-effect transistor within the third sector including a source region formed of semiconductor material of the second layer of the one conductivity type and having a surface area in said surface;

a drain region formed of semiconductor material of the second layer of the one conductivity type and having a surface area in said surface;

a first gate region of graded resistivity formed of semiconductor material of the second layer converted to the opposite conductivity type, said first gate region having a surface area in said surface and lying interposed between the source and drain regions;

a channel region of uniform resistivity formed of semiconductor material of the second layer of the one conductivity type and extending between the source and drain regions; and a second gate region of graded resistivity formed of semiconductor material of the second layer converted to the opposite conductivity type, said second gate region completely surrounding the source, drain, and channel regions and having a surface area in said surface.

7. A monolithic integrated circuit structure in accordance with claim 6 including a fourth isolation barrier of the one conductivity type extending through the first layer into the substrate and into the second layer to form a fourth sector including an electrically isolated section of the first layer and the overlying section of the second layer;

a second junction field-effect transistor, complementary to the first junction field-effect transistor, within the fourth sector including a source region formed of semiconductor material of the first layer of the opposite conductivity type;

a source contact formed of semiconductor material of the second layer converted to the opposite conductivity type, said source contact having a surface area in said surface and extending to the source region;

a drain region formed of semiconductor material of the first layer of the opposite conductivity type;

a drain contact formed of semiconductor material of the second layer converted to the opposite conductivity type, said drain contact having a surface area in said surface and extending to the drain region;

a gate region of graded resistivity formed of semiconductor material of the first layer converted to the one conductivity type and lying interposed between the source and drain regions;

a gate contact formed of semiconductor material of the first layer of the one conductivity type, said gate contact having a surface area in said surface and extending to the gate region; and a channel region of uniform resistivity formed of semiconductor material of the first layer of the opposite conductivity type and extending between the source and drain regions.

8. A monolithic integrated circuit structure in accordance with claim 7 wherein the one conductivity type is N-type; and the opposite conductivity type is P-type;

whereby the first bipolar transistor is a PNP-transistor, the second bipolar transistor is an NPN-transistor, the first junction field-effect transistor is an N-channel field-effect transistor, and the second junction field-effect transistor is a P-channel field-effect transistor.

* * * * *